(12) United States Patent
Escowitz et al.

(10) Patent No.: US 11,590,719 B2
(45) Date of Patent: Feb. 28, 2023

(54) METHOD AND COMPOSITIONS FOR EMBEDDING ELECTRONICS IN FIBER-COMPOSITE PARTS FABRICATED VIA COMPRESSION MOLDING

(71) Applicant: Arris Composites Inc., Berkeley, CA (US)

(72) Inventors: Ethan Escowitz, Berkeley, CA (US); Riley Reese, Oakland, CA (US); J. Scott Perkins, Oakland, CA (US); Erick Davidson, Piedmont, CA (US)

(73) Assignee: Arris Composites Inc., Berkeley, CA (US)

( * ) Notice: Subject to any disclaimer, the term of this patent is extended or adjusted under 35 U.S.C. 154(b) by 77 days.

(21) Appl. No.: 17/323,240

(22) Filed: May 18, 2021

(65) Prior Publication Data
US 2021/0354406 A1    Nov. 18, 2021

Related U.S. Application Data

(60) Provisional application No. 63/026,383, filed on May 18, 2020.

(51) Int. Cl.
*H05K 3/30* (2006.01)
*B29C 70/24* (2006.01)
(Continued)

(52) U.S. Cl.
CPC ........... *B29C 70/70* (2013.01); *H05K 1/0366* (2013.01); *H05K 1/185* (2013.01); *H05K 3/30* (2013.01);
(Continued)

(58) Field of Classification Search
CPC ........ H05K 1/185; H05K 1/0366; H05K 3/30; B29C 70/24; B29C 70/38; B29C 70/44;
(Continued)

(56) References Cited

U.S. PATENT DOCUMENTS 4,680,617 A    7/1987  Ross
5,580,643 A *  12/1996 Kennedy ........... C04B 35/62855
                                                    428/404
(Continued)

FOREIGN PATENT DOCUMENTS

CN    104236393 A    12/2014
EP    2419252 A1     2/2012
(Continued)

OTHER PUBLICATIONS

Authorized Officer: Klinger, Thierry, International Search Report and Written Opinion issued in PCT application No. PCT/US2021/032915, dated Sep. 3, 2021, 12 pp.
(Continued)

*Primary Examiner* — Xiaoliang Chen
(74) *Attorney, Agent, or Firm* — Kaplan Breyer Schwarz, LLP

(57) ABSTRACT

A fiber-composite part having one or more electronic components that are located in arbitrary regions of the internal volume of the part are fabricated using a preform charge. The preform charge has a structure that corresponds to that of the mold cavity in which the part is being formed. By incorporating the electronic components in the preform charge, such components are then precisely located, spatially oriented, and constrained, and such location and orientation is maintained during molding to produce a part with the electronic components in the desired locations and orientations within its internal volume.

10 Claims, 5 Drawing Sheets

(51) Int. Cl.
| | |
|---|---|
| *B29C 70/38* | (2006.01) |
| *B29C 70/44* | (2006.01) |
| *B29C 70/70* | (2006.01) |
| *B29C 70/88* | (2006.01) |
| *B32B 5/12* | (2006.01) |
| *B32B 5/22* | (2006.01) |
| *B32B 5/24* | (2006.01) |
| *C04B 35/20* | (2006.01) |
| *C04B 35/581* | (2006.01) |
| *H05K 1/18* | (2006.01) |
| *H05K 1/03* | (2006.01) |
| *B29K 307/04* | (2006.01) |
| *B29K 101/12* | (2006.01) |
| *B29K 105/08* | (2006.01) |
| *B29L 31/34* | (2006.01) |
| *B29K 309/08* | (2006.01) |

(52) U.S. Cl.
CPC .............. *B29K 2101/12* (2013.01); *B29K 2105/0881* (2013.01); *B29K 2307/04* (2013.01); *B29K 2309/08* (2013.01); *B29L 2031/34* (2013.01); *H05K 2201/0275* (2013.01)

(58) Field of Classification Search
CPC ....... B29C 70/70; B29C 70/88; B29C 70/345; B29C 70/543; B29C 70/545; B29C 70/549; B32B 5/12; B32B 5/022; B32B 5/024; C04B 35/20; C04B 35/581; C04B 35/62852
USPC ......... 361/761; 264/257; 428/212, 336, 361, 428/378, 404
See application file for complete search history.

(56) References Cited

U.S. PATENT DOCUMENTS

| | | | |
|---|---|---|---|
| 2005/0146076 A1* | 7/2005 | Alexander | B29C 70/24 264/257 |
| 2015/0375481 A1 | 12/2015 | Boursier | |
| 2018/0290405 A1 | 10/2018 | Lachat et al. | |
| 2018/0291750 A1* | 10/2018 | Corsmeier | F01D 5/282 |
| 2020/0114596 A1 | 4/2020 | Davidson et al. | |
| 2020/0130297 A1 | 4/2020 | Escowitz et al. | |
| 2021/0402719 A1* | 12/2021 | Guha | B32B 5/12 |

FOREIGN PATENT DOCUMENTS

| | | |
|---|---|---|
| WO | 2010/119414 A1 | 10/2010 |
| WO | 2018/226782 A1 | 12/2018 |

OTHER PUBLICATIONS

Fixture and Method for Use in a Molding Process, U.S. Appl. No. 16/877,236.

Simultaneous Topology and Fiber Alignment Optimization for Anisotropic Materials, U.S. Appl. No. 16/811,537.

* cited by examiner

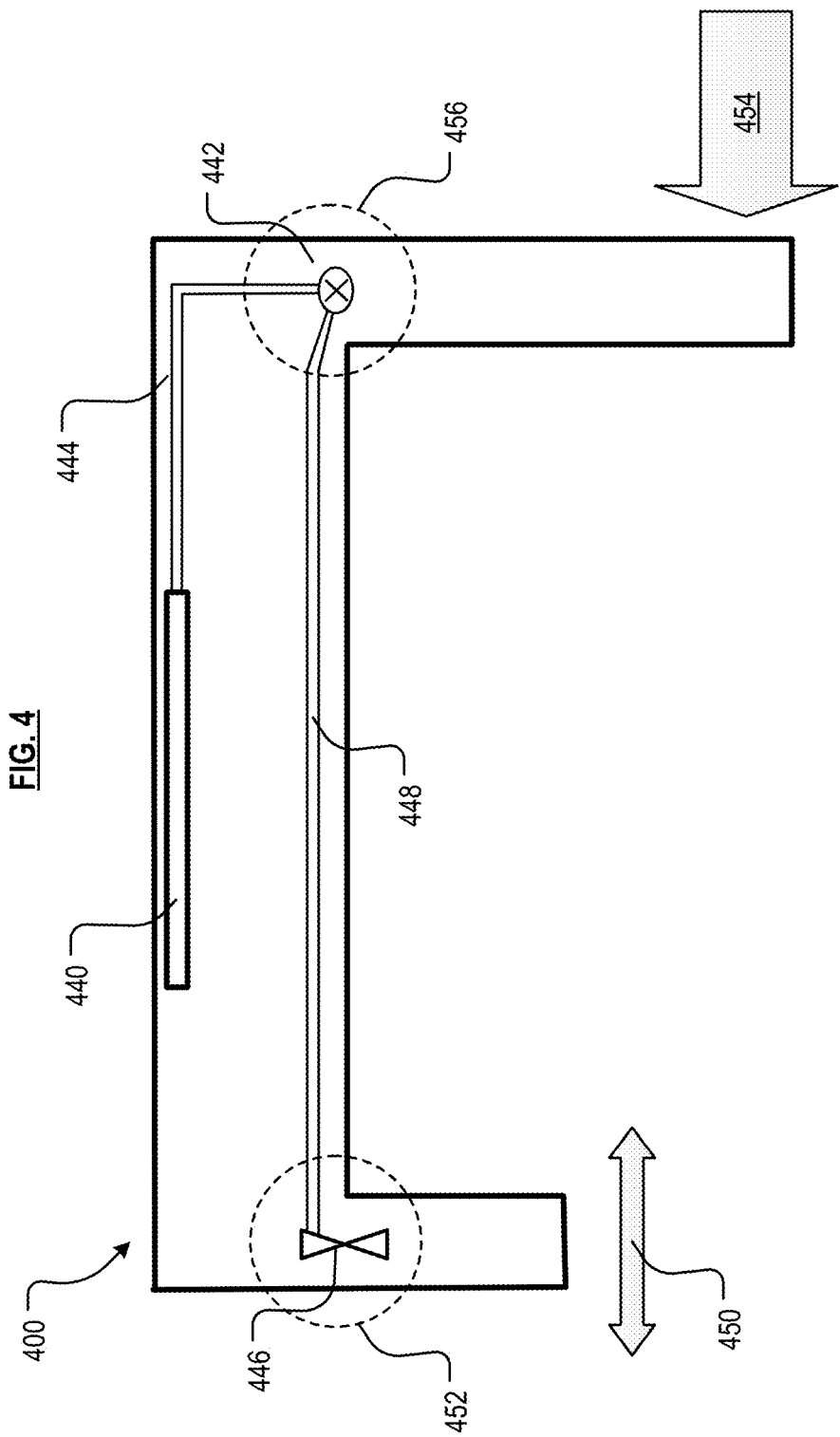

METHOD AND COMPOSITIONS FOR EMBEDDING ELECTRONICS IN FIBER-COMPOSITE PARTS FABRICATED VIA COMPRESSION MOLDING

FIELD OF THE INVENTION

The present invention pertains to additive molding of fiber-composite materials.

BACKGROUND OF THE INVENTION

For many applications, it would be desirable to have a fiber-composite part that incorporates electronic components. For such applications, incorporated electronics will typically need to be at a precise location so as to properly interface with other electronic components on other parts.

Currently, technologies for fabricating molded parts are limited in terms of their ability to "embed" electronics; that is, there is an inability to locate an electronic component at an arbitrary location within the volume of a part. An exception to this is multi-step molding techniques, such as "over-molding," wherein a portion of a part is formed with an electronic component at its surface, and then further molding steps are performed in which additional resin is added, covering the component.

In a single-step compression-molding process, however, positioning and restraining a component during molding typically requires the use of registration features, which are conventionally located at the surface of the mold. Consequently, during the molding process, the electronic component must typically be placed in the mold cavity at a location that is near to the surface of the mold to engage such features. The result is a molded part with an electronic component residing on its surface, as opposed to being at a location within its internal volume.

The aforementioned limitation is due, at least in part, to the nature of the feedstock constituents or "charge" to the molding process. In prior-art molding technologies, the charge can generally be described as having either a "particulate" or a "laminate" form factor.

Particulate-based charge (e.g., chopped-fiber segments, BMC, polymer pellets, SMC, etc.) has no inherent organization or orientation; it is usually placed near the center of a mold, with a primary focus on total mass of the charge. Indeed, particulate charge is randomly oriented throughout the molding process, so any notion of particulate alignment/ orientation/organization is meaningless. As a consequence, a particulate-based charge itself cannot locate, index, or register embedded components, at least in a single-step molding process.

Laminate form factors (e.g., composite plies, resin infusion sheets, etc.) provide a single dimension of indexing capability. In particular, a ply can support/define an electronic component's "vertical" position within a part's thickness (i.e., between layers of laminate), but the plies' planar nature prevents them from registering the lateral position of the electronics.

It will be appreciated that absent sufficient constraint, electrical components can become improperly located and/ or spatially oriented in a final part. Thus, it has been challenging or impossible to embed a component at a desired arbitrary location within a part's internal volume in a single-step molding process.

SUMMARY OF THE INVENTION

The present invention provides a way to embed and constrain, with acceptable precision, electronic components at any location within a molded part's internal volume. Embodiments of the invention enable increased design latitude by embedding electronics independently of a part's surface. And, of course, as compared to a surface component, an embedded component is better protected from external environmental stressors (e.g., chemicals, direct impacts, etc.).

In accordance with the illustrative embodiment, a preform charge is used to precisely locate, spatially orient, and constrain electronic components at any desired region within a molded part's internal volume. The method applies to single-step compression-molding processes.

A preform charge is an assemblage of fiber-bundle-based preforms. As the term is used herein, a fiber-bundle-based-preform is a collection of unidirectionally arranged, typically same-length fibers (numbering in the thousands), that are impregnated with a polymer resin. Such preforms can be sourced, for example and without limitation, from towpreg. Thus, in some embodiments, preforms are simply segments of towpreg, and have the same linear form (i.e., a rod) as towpreg. In some other embodiments, the bundle of fibers is also bent into a desired shape, either before or after cutting, so as to fit a contour of the mold and/or to position/align (e.g., with principal stress vectors, etc.) the fibers of preform in certain discrete regions of the mold. Thus, in addition to a simple linear form, preforms may have any one of a variety of relatively complex shapes, including, without limitation, non-linear shapes, closed-form shapes, planar shapes, non-planar (3D) shapes, and multi-layer shapes, as appropriate for a particular mold and the part to be fabricated therefrom.

In preparation for molding a part, these fiber-bundle-based preforms can be added, one at a time, to a mold, during a "lay-up" process. The advantage of using fiber-bundle-based preforms, as practiced by applicant, is that fibers can be aligned in the mold to a far greater extent and with much greater precision than is possible using bundles of fibers in the form of ribbon/tape, or laminates (not to mention chopped fiber) as in the prior art. Such precise alignment results in superior part properties, enabling a part, for example, to better resist the forces to which it is subjected during use.

Alternatively, and generally preferable to a "lay-up," is to fabricate a pre-assembled group of preforms—a preform charge—that is added to the mold and serves as the constituents from which the part is molded. The preform charge, which is typically a three-dimensional arrangement of preforms, is usually created in a fixture separate from the mold, and which is dedicated and specifically designed for that purpose. To create a preform charge, preforms are placed (either automatically or by hand) in a preform-charge fixture. By virtue of the configuration of the fixture, the preforms are organized into a specific geometry and then "tacked" together. Tacking can be performed by heating the assemblage of preforms to the point of softening (but not melting), and then applying minimal compressive force. The temperature to which the bundles are heated is a function of the resin being used; it is within the capabilities of those skilled in the art to select a temperature for tacking as a function of resin type. With respect to compressive force, gravity alone may be sufficient, or a slight clamping pressure may be applied. The assemblage is then cooled. Due to the minimal application of pressure, the resulting preform charge is not fully consolidated. Considerably more pressure is required for full consolidation (i.e., typically thousands of pounds of pressure versus less than a hundred pounds or so for forming the preform charge). But once joined in this fashion, the preforms will not move, thereby maintaining the desired geometry and the specific alignment of each preform in the assemblage. The shape of the preform charge usually mirrors that of the intended part, or a portion of it. See, e.g., Publ. Pat. App. US2020/0114596 and U.S. patent application Ser. No. 16/877,236, incorporated herein by reference.

In accordance with embodiments of the invention, applicant's preform charge structure is used to great advantage to precisely position an electronic component in an arbitrary location within the volume of a part. In particular, the positional resolution and structural capacity of the preform charge's constituent preforms enables embedded components to be located and constrained by the charge itself, rather than aspects of the tooling. It is notable that the shape and size of a preform charge typically mirrors that of the mold cavity in which it is placed. As such, placing a preform charge in a mold cavity necessarily registers all elements of the preform charge (e.g., fibers, electronic components) relative to the mold cavity, and hence defines the position of such elements in the final part. Thus, as desired, electronic (or other) components can be positioned fully (or partially) independently of the mold tooling (e.g., surface-based registration features, etc.).

Just as preforms are positioned relative to one another for resultant fiber alignment in a final part, embedded components are positioned for resultant location and spatial orientation in a final part. Incorporation of such components requires unique considerations, since they typically do not have a resin coating that can be "tacked" to the surrounding preforms. Rather, in accordance with the present teachings, an electronic component is mechanically constrained by the surrounding preforms. That is, the act of tacking the surrounding preforms immobilizes the electronic component(s). In some embodiments, an advance limited tacking procedure is performed, wherein the preforms immediately surrounding an electronic component are first tacked to one another, before the bulk of the preforms in the preform charge are tacked together.

Examples of components that can be embedded in accordance with the present teachings include, without limitation, antennas, electromagnetic shielding, wires, inductive charging coils, connective leads (e.g., strips, pins, etc.), dielectric layers, piezoelectric generators, sensor modules, strain gauges, and printed circuit boards (PCBs).

As electronics become increasingly integrated into primary structures, embodiments of the invention provide valuable design latitude over the prior art. Notably, components can be internally positioned beyond a part's surface for optimal performance, individual components can be merged in-situ to create an emergent circuit, and components can either be isolated from or combined with the surrounding composite to ensure proper function.

Furthermore, components embedded via the invention can be electrically integrated into larger assemblies. This is accomplished through aspects of the tooling or layup that passively or actively expose conductive leads on a molded part's surface. Exposure of such leads enables transmission of external current to internally embedded components, or visa-versa.

BRIEF DESCRIPTION OF THE DRAWINGS

FIG. 4 depicts a part having plural embedded electrical components that are coupled to one another in accordance with an embodiment of the invention.

DETAILED DESCRIPTION

Figure 1:
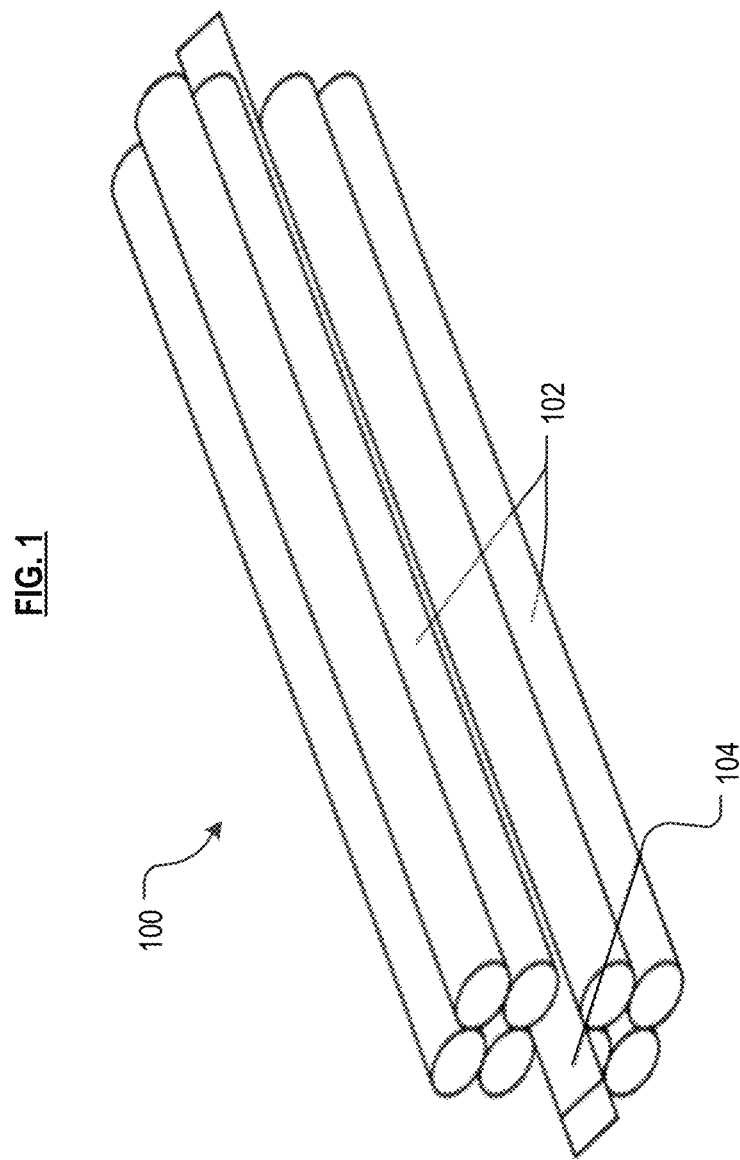
FIG. 1 depicts a preform charge with an electrical component incorporated therein in accordance with the present teachings.

Definitions. The following terms are defined for use in this description and the appended claims:

"Tow" means a bundle of fibers (i.e., fiber bundle), and those terms are used interchangeably herein unless otherwise specified. Tows are typically available with fibers numbering in the thousands: a 1K tow, 4K tow, 8K tow, etc.

"Prepreg" means fibers that are impregnated with resin.

"Towpreg" means a fiber bundle (i.e., a tow) that is impregnated with resin.

"Preform" means a bundle of plural, unidirectionally aligned, same-length, resin-wetted fibers. The bundle is often (but not necessarily) sourced from a long length of towpreg. That is, the bundle is a segment of towpreg that has been cut to a desired size and, in many cases, is shaped (e.g., bent, twisted, etc.) to a specific form, as appropriate for the specific part being molded. The cross section of the preform, and the fiber bundle from which it is sourced typically has an aspect ratio (width-to-thickness) of between about 0.25 to about 6. Nearly all fibers in a given preform have the same length (i.e., the length of the preform) and, as previously noted, are unidirectionally aligned. Applicant's use of the term "preform" means a fiber-bundle-based preform, and explicitly excludes any size of shaped pieces of: (i) tape (typically having an aspect ratio—cross section, as above—of between about 10 to about 30), (ii) sheets of fiber, and (iii) laminates.

"Consolidation" means, in the molding/forming arts, that in a grouping of fibers/resin, void space is removed to the extent possible and as is acceptable for a final part. This usually requires significantly elevated pressure, either through the use of gas pressurization (or vacuum), or the mechanical application of force (e.g., rollers, etc.), and elevated temperature (to soften/melt the resin).

"Partial consolidation" means, in the molding/forming arts, that in a grouping of fibers/resin, void space is not removed to the extent required for a final part. As an approximation, one to two orders of magnitude more pressure is required for full consolidation versus partial consolidation. As a further very rough generalization, to consolidate fiber composite material to about 80 percent of full consolidation requires only 20 percent of the pressure required to obtain full consolidation.

"Preform Charge" means an assemblage of preforms that are at least loosely bound together so as to maintain their position relative to one another. Preform charges can contain a minor amount of fiber in form factors other than fiber bundles, and can contain various inserts, passive or active. As compared to a final part, in which fibers/resin are fully consolidated, in a preform charge, the preforms are only partially consolidated (lacking sufficient pressure and possibly even sufficient temperature for full consolidation). By way of example, whereas applicant's compression-molding processes are often conducted at thousands of psi, the downward pressure applied to the preforms to create a preform charge in accordance with the present teachings is typically in the range of about 10 psi to about 100 psi. Thus, voids remain in a preform charge, and, as such, the preform charge cannot be used as a finished part.

"About" or "Substantially" means +/−20% with respect to a stated figure or nominal value.

Unless otherwise indicated, all numbers expressing, for example, quantities of ingredients used in the specification and in the claims are to be understood as being modified in all instances by the term "about." Accordingly, unless indicated to the contrary, the numerical parameters set forth in the following specification and attached claims are understood to be approximations that may vary depending upon the desired properties to be obtained in ways that will be understood by those skilled in the art. Generally, this means a variation of at least +/−20%.

Also, it should be understood that any numerical range recited herein is intended to include all sub-ranges encompassed therein. For example, a range of "1 to 10" is intended to include all sub-ranges between (and including) the recited minimum value of about 1 and the recited maximum value of about 10, that is, having a minimum value equal to or greater than about 1 and a maximum value of equal to or less than about 10.

Embodiments of the invention apply to compression-molding processes. Compression molding involves the application of heat and pressure to feed constituents for a period of time. For applicant's processes, the applied pressure is usually in the range of about 500 psi to about 3000 psi, and temperature, which is a function of the particular resin being used, is typically in the range of about 150° C. to about 400° C. Once the applied heat has increased the temperature of the resin above its melt temperature, it is no longer solid. The resin will then conform to the mold geometry via the applied pressure. Elevated pressure and temperature are typically maintained for a few minutes. Thereafter, the mold is removed from the source of pressure and is cooled. Once cooled, the finished part is removed from the mold.

In a composite material, the matrix (resin) possesses isotropic material properties, whereas the fibers present anisotropic properties that largely define the performance of the part. By controlling the orientation of the fibers, one skilled in the art can improve aspects of the performance of a composite part. For example, aligning fibers along the anticipated in-use principal stress vector(s) of the part maximizes structural performance of the part.

In applicant's compression-molding processes, the alignment of fibers in the mold cavity, and in the final part, corresponds primarily to the geometry of the preform(s)/preform-charge(s), and their placement in the mold cavity. Thus, by determining/estimating the principal in-use stress vectors of a part, a desired fiber alignment is determined. Based on the desired fiber alignment, and part geometry, appropriate preform/preform-charge geometry is established.

Fibers suitable for use in conjunction with the invention include any type of fiber that can withstand the operating temperatures of the molding process being used, such as the compression molding process. Typically, that temperature is a function of resin selection. Examples of suitable fiber include, without limitation, carbon, glass, natural fibers, aramid, boron, metal, ceramic, polymer filaments, and others. Non-limiting examples of metal fibers include steel, titanium, tungsten, aluminum, gold, silver, alloys of any of the foregoing, and shape-memory alloys. "Ceramic" refers to all inorganic and non-metallic materials. Non-limiting examples of ceramic fiber include glass (e.g., S-glass, E-glass, AR-glass, etc.), quartz, metal oxide (e.g., alumina), alumina silicate, calcium silicate, rock wool, boron nitride, silicon carbide, and combinations of any of the foregoing. Furthermore, carbon nanotubes can be used.

Each individual fiber can be formed of a single material or multiple materials (such as from the materials listed above), or can itself be a composite. For example, an individual fiber can comprise a core (of a first material) that is coated with a second material, such as an electrically conductive material, an electrically insulating material, a thermally conductive material, or a thermally insulating material. Moreover, individual fibers can include an exterior coating such as, without limitation, sizing, to facilitate processing, adhesion of binder, minimize self-adhesion of fiber.

The fibers within the towpreg can have any diameter, which is typically but not necessarily in a range of 1 to 100 microns. The cross-sectional shape of the fiber can be circular, oval, trilobal, polygonal, etc.

Any thermoplastic resin can be used in conjunction with embodiments of the invention. Resins suitable for use in conjunction with embodiments of the invention include any thermoplastic, such as, without limitation, acrylonitrile butadiene styrene (ABS), nylon, polyaryletherketones (PAEK), polybutylene terephthalate (PBT), polycarbonates (PC), and polycarbonate-ABS (PC-ABS), polyetheretherketone (PEEK), polyetherimide (PEI), polyether sulfones (PES), polyethylene (PE), polyethylene terephthalate (PET), polyphenylene sulfide (PPS), polyphenylsulfone (PPSU), polyphosphoric acid (PPA), polypropylene (PP), polysulfone (PSU), thermoplastic polyurethane (TPU), polyvinyl chloride (PVC). Additionally, thermoset resins can be used in conjunction with the embodiments of the invention. Exemplary thermosets include, without limitation, polyester, thermoset polyurethane, epoxy, polyimides, and vinyl ester.

Embodiments of the invention involve placement of one or more electronic components within a preform charge. Determination of an electrical component's position in a preform charge first requires specification of the desired location in the molded part. In a similar manner to preforms being in the charge per desired fiber alignment in the molded part, components are purposefully inserted during the charge assembly sequence. However, whereas unity of a charge's constitute preforms is dependent on matrix (resin) bonding, electrical components generally cannot be joined to the surrounding preforms in this manner.

To compensate for the fact that such components cannot be bonded directly to surrounding preforms, they must instead be mechanically constrained via the preforms. Absent such constraint, the component could move during material handling or during the compression molding process itself.

Constraining a component via surrounding preforms is accomplished during the preform charge assembly sequence. Based on the desired location of the component in the molded part, it is incorporated into the charge accordingly. This determination is dictated by a volumetric assessment of surrounding preforms. That is, a component is incorporated into a nascent preform charge once the quantity of preforms present provides the necessary post-consolidation volume beneath the component so that the component, once embedded, is sited as desired. Placement of the component is achieved through appropriately designed end-of-arm tooling on material handling robots used in the process, or by a human operator. Thus, for example, it might be determined that component is introduced into the nascent preform charge after 15 layers of preforms have been placed in the preform-charge fixture.

Once incorporated into the nascent preform charge, the component is constrained by placement of successive preforms on its remaining exposed surfaces, essentially encasing it among the preforms. Registration of the component during this process can be achieved either through aspects of the preform-charge fixture or by intermediate bonding of supporting preforms (i.e., those local to the component) during preform-charge assembly. Once adequately encased, heat and pressure are applied via the charge fixture, per applicant's processes, to tack together the assemblage of preforms, forming a component-bearing preform charge. The applied heat and pressure are not to exceed the specified conditions that the component is able to withstand.

FIG. 1 depicts preform charge 100, including a plurality of fiber-bundle-based preforms 102, and constrained electrical component 104. Preform charge 100 includes eight linear fiber-bundle-based preforms. It is to be understood that in other embodiments, a preform charge can include fewer or more preforms, and the preforms can be linear or non-linear, as best suits the part being molded and the mold being used.

As used in this description and the appended claims, the terms "electrical component" or "electronic component" means any component that generates, transmits, receives, or processes an electrical signal. It is notable that the insertion of a wires, conductive leads/traces, etc., into molding constituents of a molding process do not necessarily implicate the same placement concerns as that of an electronic component. Embodiments of the invention are thus directed to the placement of electronic components, as opposed to wires, leads, etc., which simply creating electrical coupling between such components.

The preform charge, with a component, such as electrical component 104 incorporated therein, is then subjected to the compression-molding process to yield a molded part. A unique aspect of the invention is that a multitude of components that are initially isolated in the charge can be merged during the molding cycle, thus yielding emergent circuitry.

It is notable that (full) consolidation of a preform charge into a molded part involves a significant reduction in volume (typically in the range of about 300% to 1000%), as voids present in the charge are removed under pressure. This volume reduction happens in all spatial dimensions, but the application of force responsible for this reduction generally occurs along a vertical axis. Although lateral displacement of preforms can occur, the largest magnitude of displacement during consolidation thus occurs parallel to the application of force (i.e., along the vertical axis).

Consequently, components located on different vertical layers (i.e., planes) of a preform charge will undergo varying degrees of displacement. This is attributable to the proportional consolidation of the preforms that underlie the component in the preform charge. For a given packing efficiency of preforms in a charge (i.e., how tightly they are packed together), a relatively greater number of underlying preforms will displace a relatively greater amount than a relatively lower number of preforms in an adjacent region.

Assuming constant packing efficiency, the vertical displacement at a given location thus scales proportionally to the charge thickness underlying that location. Although the final positioning of components can thus be estimated, best practice is to perform several trial runs, placing "dummy" components in the preform charge (placement based on the aforementioned a priori knowledge), and observing the final position after compression molding.

As a result of this proportional displacement, the distance between components on different vertical layers in a charge will decrease to a different extent during molding. Subsequently, any electrical path uniting such components in a charge will necessarily be subject to deformation during molding. To mitigate the risk of current shorts, such deformation is undesirable. It is therefore advantageous to have components be initially separate in a charge, and then brought into contact via the molding cycle. Soldering can accompany such contact in certain embodiments.

For example, in one embodiment, an antenna located on or near a given part's surface can be merged with a piezoelectric generator located in a cyclically stressed region of the part. To transmit signals with minimal interference, the optimal location for the antenna is the surface. Conversely, to provide power necessary for signal transmission, the piezoelectric generator is optimally located at an internal, cyclically stressed region of the part. Repeated stress cycles within this region causes voltage generation, which in turn powers signal transmission. Due to the different vertical positions of these components in the preform charge, the electrical infrastructure (i.e., wires) connecting them is merged in-situ.

In another illustrative embodiment, individual PCB layers are merged to each other, and to conductive leads on a given part's surface. That is, individual PCB layers are incorporated into the preform charge with alternating dielectric layers between them. The molding process then merges these layers in-situ. Further, the displacement of the merged PCB brings it into contact with connective leads on the part's surface. The connective leads on the surface enable electrical integration of the molded part into a larger assembly, while the embedded PCB is protected from operating conditions.

In many relevant applications beyond these exemplary embodiments, electronic components embedded within parts must interface and function within a larger assembly. As such, the present invention encompasses methods by which components are either isolated from or integrated into a subsequent assembly for proper function. Isolation or integration required by an assembly is accomplished through use of appropriate raw materials and/or aspects of associated tooling.

Carbon fiber, a common constituent in composites, is electrically conductive and attenuates radio frequency (RF) signals. While such properties are beneficial in certain scenarios, they are detrimental in others. An embedded GPS antenna, for example, will not be able to receive an RF signal if it is surrounded by carbon-fiber composite.

To minimize RF-signal attenuation, preforms having glass fiber rather than carbon fiber are utilized between a component and an incident surface. While such an approach is known in the prior art, constraining such RF components and encasing them in glass fiber preforms in a preform charge in accordance with the present teachings is not.

Given carbon fiber's electrical conductivity, it is necessary to incorporate a dielectric layer between components and the surrounding composite in certain scenarios. While transparent to RF, glass fiber is also electrically conductive, so incorporation of dielectric layers is applicable to both fiber types.

Dielectric layers, which are used for insulating components from constituent fibers in the surrounding composite, are integrated during the preform-charge assembly process. Such layers are comprised of neat resin, which is generally the same resin used in the preforms. The layers are placed into a nascent preform charge such that the electronic component is sheathed on all surfaces. During molding, the dielectric sheath bonds to the matrix of the surrounding composite, but does so without permitting fibers to contact the component.

In addition to embodiments in which embedded components are electrically isolated, some embodiments integrate components for necessary function within a larger assembly. This primarily involves exposed connective leads on the surface of a given molded part. Transfer of electric power between components in an assembly is often required for such integration. Connective leads on a molded part's surface provide the means to transfer power necessary for integration into an assembly.

Connective leads can have a variety of form factors, as suits the requirements of a particular application. These include, without limitation, round pins, flat pins, strips flush to a surface, strips proud of a surface, and any combination thereof across multiple locations on the surface of a given molded part. Such form factors can be standardized geometries or customized per application specifics. The connective leads can function as anodes or cathodes.

To ensure proper integration into an assembly, connective leads must be accurately located on the surface of a molded part. Considering this requirement, and the fact that such leads are on a surface of the part, tooling aspects of the mold are employed to position and maintain exposure of leads. As with any feature of a precision mold, such tooling aspects are consistently and accurately positioned across many cycles. Further, they are mechanically straightforward to design into the surface of a mold.

Tooling aspects used in conjunction with embodiments of the invention can be passive or active. In some embodiments, a single mold can employ plural tooling aspects to site connective leads. To ensure proper indexing of leads before inserting a preform charge into a mold, components can be constrained via the preform charge or pre-loaded into tooling aspects to merge with associated components in-situ.

Passive tooling aspects are those in which connective leads are held in a fixed surface position during the molding process. Specifically, static tooling aspects include bosses, embosses, slots, or any other registration geometry suitable for holding a lead in a specified position while the preform charge fully consolidates under heat and pressure.

Active tooling aspects are those in which mechanical actuations during processing expose connective leads as desired. That is, at specified stages of the molding sequence, active tooling aspects dynamically change position to force electrical contacts proud, flush, or sub-flush to a given surface. For example, a strip contact can be pulled proud of a surface once the nearby composite material is below the melting temperature and will not flow into the resultant void space. In an alternative embodiment, a strip lead can be forced sub-flush to a surface while the surrounding composite is still viscous.

Thus, the invention provides methods by which electronic components are internally embedded into molded parts. Specifically, these methods include incorporation of components into preform charges, merging multiple components during compression molding, and isolating and/or integrating components per the requirements of a larger assembly.

Figure 2:
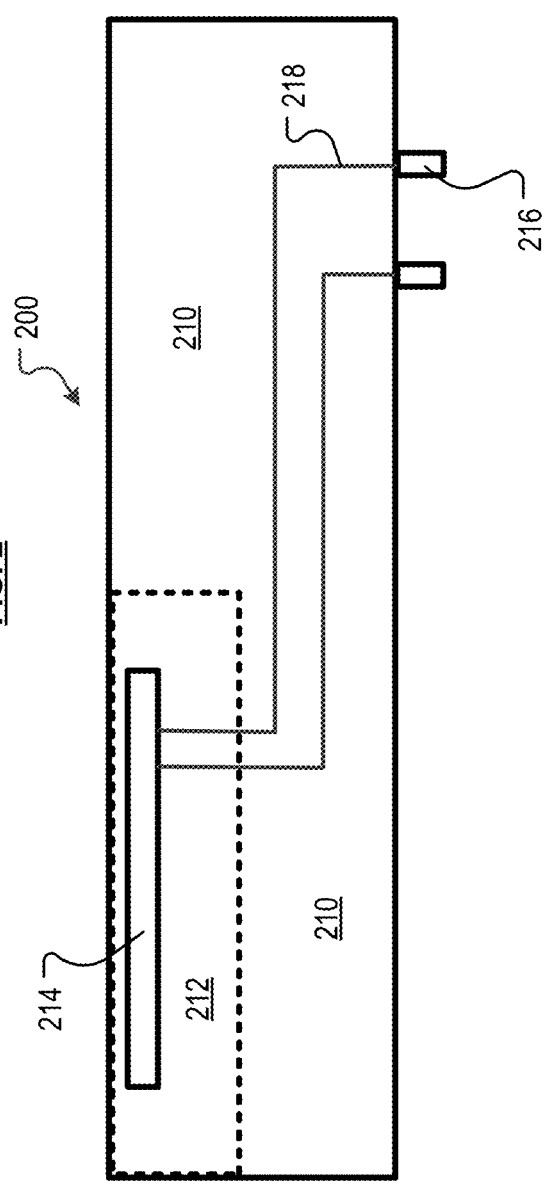
FIG. 2 depicts a fiber-composite part including an embedded electrical component in accordance with an embodiment of the invention.

FIG. 2 depicts fiber-composite part 200 having embedded electrical components in accordance with an illustrative embodiment of the present invention. Part 200 includes GPS antenna 214, electrical contacts 216, and wires/conductive traces 218.

Fiber-composite part 200 includes regions 210 and region 212. Region 210 comprises carbon fiber in a matrix formed from a thermoplastic resin, and region 212 comprises glass fiber in a matrix formed from the same thermoplastic resin. As previously noted, glass fiber is substantially transparent to (minimally attenuates) RF, and, consequently, GPS antenna 214 is sited within region 212 and near to a surface of part 200.

Electrical contacts 216, which are disposed on the exterior of part 200 on a side opposite to that of GPS antenna 214, provide for signal communication to other components (not depicted). Data/signals from GPS antenna 214 is conducted to contacts 216 via wires 218.

As compared to a prior-art approach in which the GPS antenna would be surface mounted, the present invention provides a part with an embedded antenna, can do so in a single molding step hence requiring fewer processing steps to do so, and decreases the risk of exposure of the antenna and electrical wires to adverse conditions.

Figure 5:
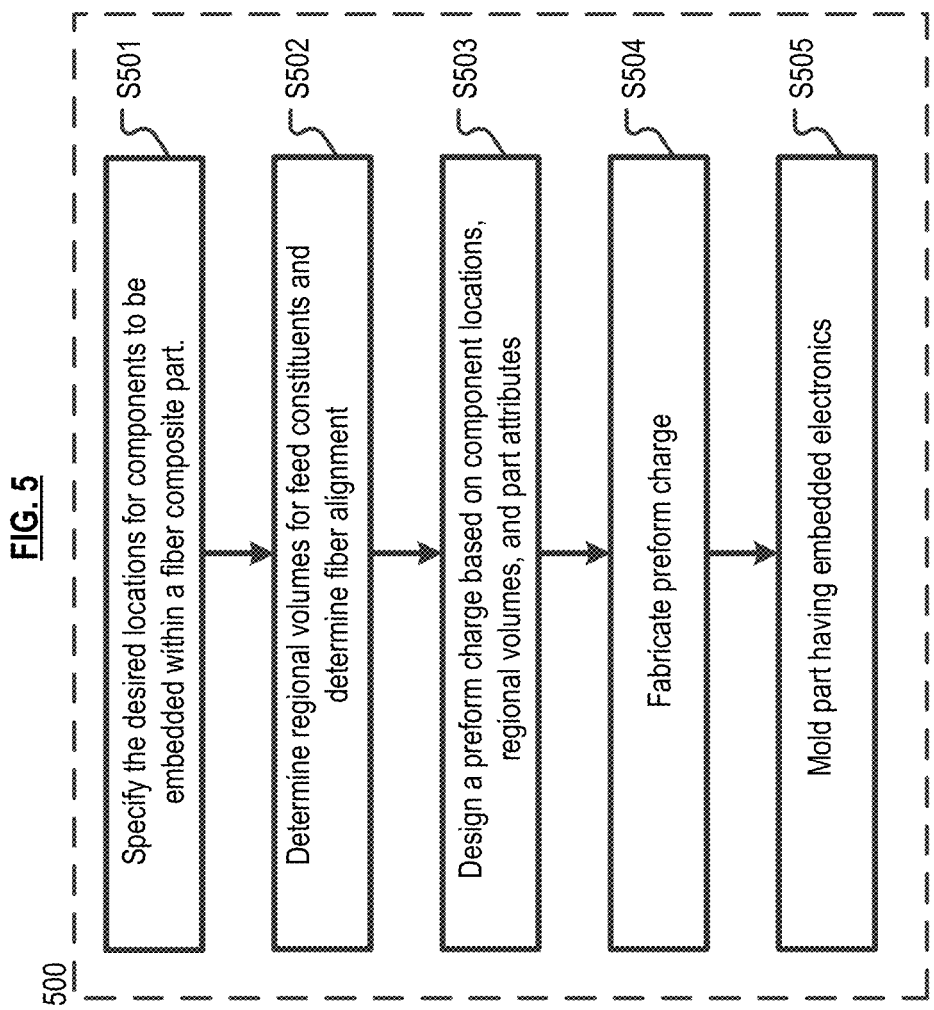
FIG. 5 depicts a method for embedding a component in an arbitrary location within a composite part's volume in accordance with the present teachings.

FIG. 5 depicts method 500 for fabricating a fiber-composite part, such as part 200. In accordance with task S501, the desired locations for the components to be embedded are specified. In task S502, the regional volumes for the constituent molding materials is determined.

Part 200 includes GPS antenna 214, and, as previously discussed, the antenna will not be able to receive an RF signal if it is surrounded by, for example, carbon fiber. Thus, glass fiber will be used in at least in the region between GPS antenna 214 and the surface of the part. The volume of the glass-fiber zone is then specified to ensure minimal signal attenuation from the incident surface. The volume of the balance of fiber, such as carbon fiber, required for the part, is then calculated.

Moreover, fiber alignment, such as to align with principal stress vectors for best mechanical performance, is calculated. The anticipated principal stress vectors arising in an in-use part can be estimated, or determined, as follows. Consider first a simple part; those skilled in the art will know, based on experience, a desired fiber alignment for best accommodating the loads experienced by the part when in use.

For more complicated scenarios, either as consequence of part geometry, the forces to which the part is subjected in use, or both, the anticipated principal stress vectors can be determined, for example, using the techniques disclosed in Pub. Pat. App. US2020/00130297, incorporated by reference herein. Briefly, that application discloses: (a) developing a description of the part's geometry, (b) developing a description of the part's anticipated loading conditions, and (c) performing a finite element analysis (FEA) on the part geometry to calculate the stress under load. This results in a three-dimensional principal stress contour map for the interior of the component. The referenced publication discloses that by considering the orthotropic material properties at hand, a preform "map" (i.e., a preform layout/arrangement) can be developed from the principal stress contour map, such as by using a technique that determines "low-cost" routing. See also, U.S. patent application Ser. No. 16/811,537.

Regarding step (c) above, for every point in a given part with a given load case, there exists a stress state with six stresses aligned with the x, y, z axes and the shear stresses between them. If one rotates that stress state such that the shear stresses go to zero, the result is three, mutually orthogonal principal stresses. Each principal stress has a magnitude (which can be zero) and a direction; hence "stress vector." The directions are orthogonal to one another. This stress tensor can rotate and change in magnitude from one element (in the finite element analysis) to the next.

In accordance with task S503, a preform charge is designed based on the desired component locations, regional volumes of molding constituents, and a desired fiber alignment.

In task S504, the preform charge is fabricated. This involves sequentially placing the preforms, plies if present, and inserting and constraining any electronic components. Fabrication typically involves the use of tool that is capable of supporting the preforms, etc., as they are sequentially arranged, as well as the application of heat to soften the preforms (i.e., soften the resin). In some embodiments, a supplementary compressing force (beyond that which is supplied by gravity) is used to force the softened materials together. Such supplementary force can be applied by a clamp that provides a relatively mild compressive force (i.e., typically less than 100 psig). The assemblage is then cooled, resulting in a preform charge. In some embodiments, the preforms or plies local to the electronic component are first selectively heated and then cooled prior to heating the bulk of the preforms/plies. This immobilizes the embedded component earlier in the processing.

Finally, in task S505, the preform charge is placed in a mold cavity and subjected to compression molding protocols to fabricate a fiber composite part with embedded electronics. As part of this task, process and tooling aspects are specified to ensure that the electronic or other components are properly merged and electrical contacts are accurately located.

Fiber composites with embedded electronics, such as art 200, can then be integrated into a larger assembly, and will function in coordination with other electrical subassemblies (not depicted). Accurate locations of contacts, such as contacts 216 ensure proper electrical connection to another electrical component, thereby distributing the received signal beyond part 200.

In some embodiments, contacts 216 are integrated during molding. Using techniques known in the art, mold features are used to index the contacts in place at a desired surface location. The contacts are paced into the indexing features before inserting the preform charge in the mold. In some other embodiments, contacts 216 are clipped onto the part after molding. In some such embodiments, small pins are positioned in the preform charge such that they extend beyond a surface of the preform charge. The pins will therefore extend beyond the surface of the molded part. After removing the part from the mold, a flexible printed circuit ("FPC") connector is coupled to the pin.

Figure 3A:
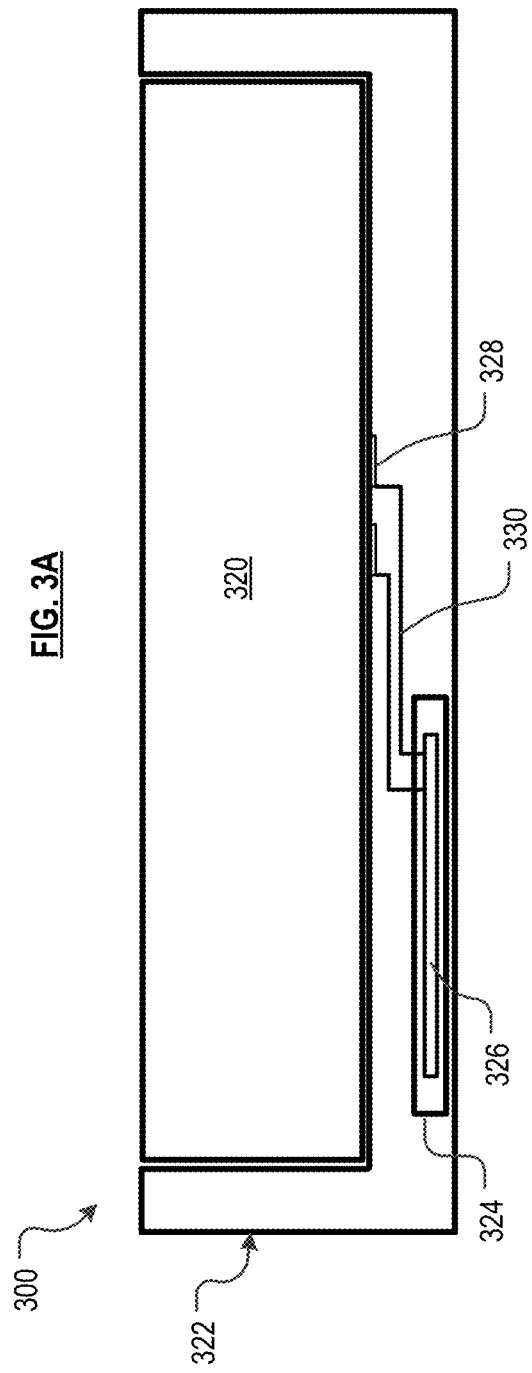
FIG. 3A depicts an assembly including a fiber-composite part having an embedded electrical component that electrically couples to a second part in accordance with an embodiment of the invention.

FIG. 3A depicts a cross section of representative mobile cellular device 300, including main assembly 320 and composite enclosure 322. Included within enclosure 322 is inductive charging coil 326 within dielectric sheath 324, contacts 328, and wires 330 that couple coil 326 to contacts 328. Inductive charging coil 326 is disposed near to the surface of enclosure 322 for charging efficiency. Current from coil 326 is routed to contacts 328, at an opposite surface of enclosure 322 and flush therewith. Power from coil 326 is distributed to assembly 320 through surface contacts 322.

A mobile cellular device such as depicted in FIG. 3A commonly employs a main assembly, and metal or plastic as a structural enclosure in the prior art. Device 300, however, includes, as the structural enclosure, molded composite enclosure 322 fabricated in accordance with the present teachings. In the illustrative embodiment, inductive charging coil 326 is disposed in composite enclosure 322. However, in some other embodiments, one or more additional components, such as a CPU, battery, LCD screen, camera, microphone, etc., can be located in composite enclosure 322, which would otherwise be located within main assembly 320 of a prior art cellular device. By embedding them in composite enclosure 322, overall device size can be reduced.

In accordance with the present teachings, the locations of the inductive charging coil, wires, and connective leads are first specified. Charging efficiency is maximized by placing the coil as close to the outer surface of the enclosure as possible, as described by the equations governing inductive charging (i.e., minimize the distance between resonant coils). Coil 326 requires electrical insulation, which is accomplished by positioning neat resin layers in the preform charge below and above the coil. Passive tooling aspects in the mold ensure proper exposure and accurate location of contacts 328, which are flush to the surface of enclosure 322.

Similar to typical enclosures, enclosure 322 will provide structural integrity to the full assembly of device 300. But unlike the prior art, device 300 incorporates embedded electronic components, by virtue of enclosure 322, into the functioning of main assembly 320. That is, power is transmitted through the wires from the coil to the leads, which interface with the assembly to power the device.

Figure 3B:
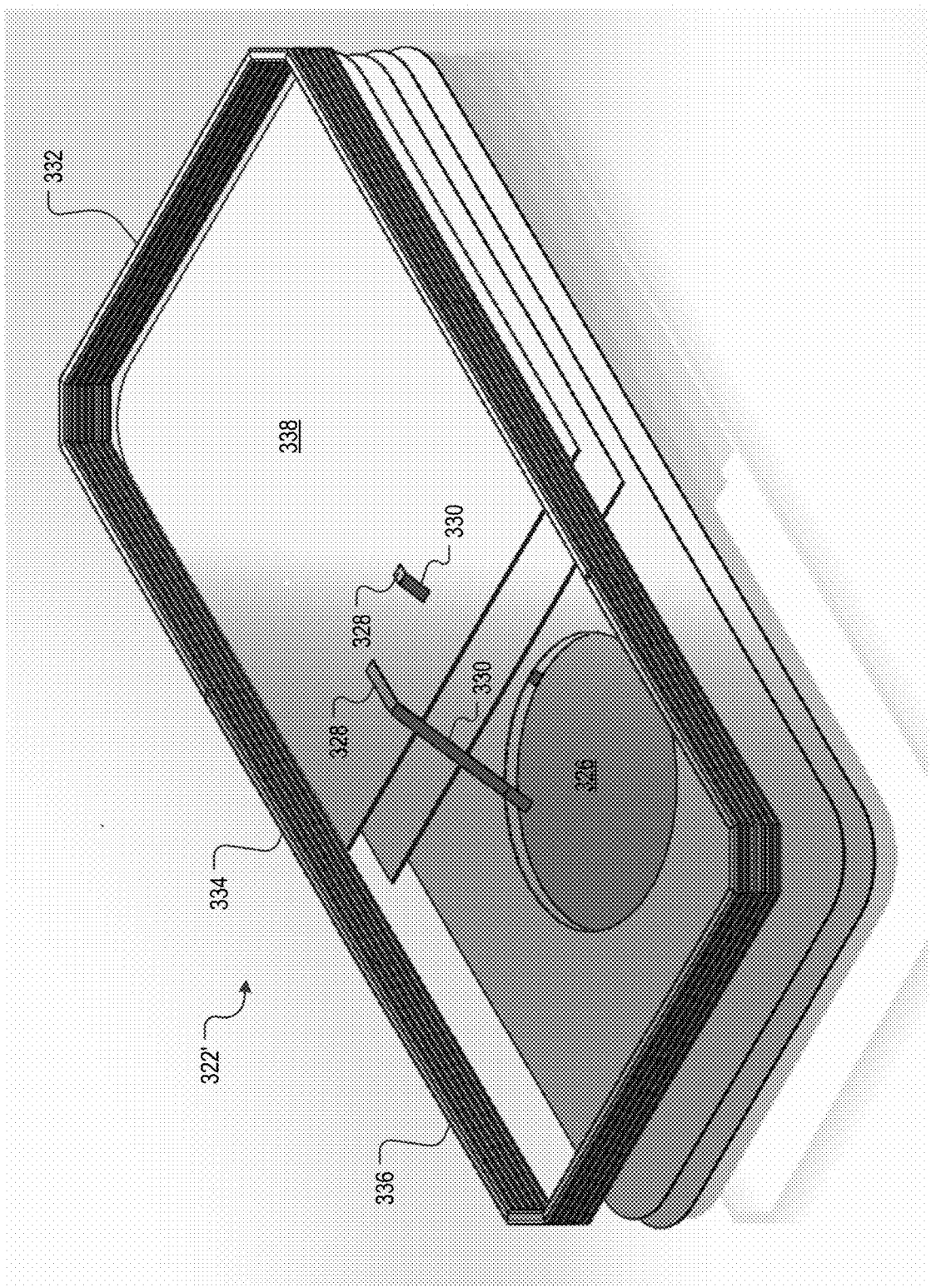
FIG. 3B depicts a preform charge suitable for forming the fiber-composite part of FIG. 3A.

FIG. 3B depicts preform charge 322' suitable for forming enclosure 322 of FIG. 3A. Preform charge 322' includes several sheets or plies 338 of fiber/resin material. Coil 326 is disposed in a cutout in one or more of plies 338. Before inserting the coil into the plies, coil 326 is coated with neat resin, which will form dielectric sheath 324. Contacts 328 are positioned flush with the uppermost ply 338. Leads 330, which are an extension of contacts 328, are attached to coil 326. As appropriate, leads 330 pass through some of plies 338.

Multiple layers of fiber-bundle-based preforms are disposed above the uppermost ply 338. Each layer has a rectangular form, created in the illustrative embodiment from four preforms. In particular, each ring includes preforms 332 and 336, each of which having a u-shaped form, and a two straight preforms 334, that couple the u-shape forms to one another to complete the ring. The ring could of course be formed from a different number of preforms, or preforms having a different shape, as will be apparent to those skilled in the art.

FIG. 4 depicts a cross section of fiber-composite part 400 having embedded electronic components. Part 400 includes RF antenna 440, strain gauge 442, piezoelectric generator 446, and wires 444 and 448.

Strain gauge 442 is disposed in highly stressed region 456 of part 400. The stress results from load 454. Piezoelectric generator 446 is disposed in cyclically (regularly) stressed region 452, which experiences a relatively lesser magnitude of stress (relative to region 456), as imparted from load 450. Current generated by piezoelectric generator 446 is conducted, via wires 448, to strain gauge 442, thus powering the strain gauge. Data is transmitted from the strain gauge over data lines 444 to RF antenna 440, which, in turn, transmits the strain data to remote monitoring equipment (not depicted). The embedded electronic thus provide a self-contained functionality.

Performance of the embedded electronics is maximized by locating piezoelectric generator 446 and strain gauge 442 at the regions of highest internal stress. Embodiments of the invention accomplish this. FEA analysis can be performed, based on the expect loads, to estimate the stress distribution throughout the part. Based on such estimates, the location of the components can be established.

It is to be understood that the disclosure describes a few embodiments and that many variations of the invention can easily be devised by those skilled in the art after reading this disclosure and that the scope of the present invention is to be determined by the following claims.

What is claimed:

1. A method for embedding one or more components at an arbitrary location in the internal volume of a fiber-composite part, the method comprising:
    specifying the desired locations for the one or more components in the internal volume of the fiber composite part;
    determining regional volumes for feed constituents and determining fiber alignment, wherein the feed constituents comprise plural fiber-bundle-based preforms, each fiber-bundle-based preform comprising a plurality of co-aligned, same-length, resin-wetted fibers;
    designing a preform charge based on the locations for the one or more components, the regional volumes, and the fiber alignment, wherein the preform charge comprises an assemblage of the feed constituents;
    fabricating a preform charge consistent with the design thereof; and
    molding the fiber-composite part via a compression molding process.

2. The method of claim 1 wherein the feed constituents comprise plies of fiber and resin.

3. The method of claim 1 wherein the plural fiber-bundle-based preforms includes a first group of fiber-bundle-based preforms and a second group of fiber-bundle-based preforms, wherein the first and second group of fiber-bundle-based preforms differ from one another in a characteristic selected from the group consisting of type of fiber, fiber volume fraction, type of resin, and fiber length.

4. The method of claim 1 wherein the plural fiber-bundle-based preforms includes a first group of fiber-bundle-based preforms and a second group of fiber-bundle-based preforms, wherein the first and second group of fiber-bundle-based preforms differ from one another based on type of fiber.

5. The method of claim 4 wherein the first group of fiber-bundle-based preforms consists essentially of resin-wetted glass fibers.

6. The method of claim 4 wherein the second group of fiber-bundle-based preforms consists essentially of resin-wetted carbon fibers.

7. The method of claim 1 wherein fabricating a preform charge comprises:
    heating the assemblage of feed constituents to a temperature at which resin in the feed constituents softens, but does not melt;
    applying compressive force to the assemblage, wherein application of the compressive force and the temperature result in partial consolidation, but not full consolidation, of the feed constituents; and
    cooling the assemblage.

8. The method of claim 1 wherein one or more components are electronic components.

9. The method of claim 8 wherein the fiber-composite part includes plural electronic components, and wherein molding the fiber composite part comprises specifying process and tooling to ensure that at least some of the plural electronic components electrically couple to one another.

10. The method of claim 1 wherein the fiber-composite part is molded via a single molding run of the compression-molding process.

* * * * *